United States Patent
Schleuning et al.

(10) Patent No.: US 8,446,926 B2
(45) Date of Patent: May 21, 2013

(54) BROAD-AREA EDGE-EMITTING SEMICONDUCTOR LASER WITH LIMITED THERMAL CONTACT

(75) Inventors: David Schleuning, Oakland, CA (US); Kenneth D. Scholz, Palo Alto, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 13/534,372

(22) Filed: Jun. 27, 2012

(65) Prior Publication Data
US 2012/0263201 A1   Oct. 18, 2012

Related U.S. Application Data (63) Continuation of application No. 13/092,797, filed on Apr. 22, 2011, now Pat. No. 8,233,513, which is a continuation of application No. 13/044,359, filed on Mar. 9, 2011, now abandoned.

(51) Int. Cl.
*H01S 3/04* (2006.01)

(52) U.S. Cl.
USPC .................................. 372/36; 372/34

(58) Field of Classification Search ............ 372/36, 372/34
See application file for complete search history.

(56) References Cited

U.S. PATENT DOCUMENTS
6,636,539 B2   10/2003   Martinsen

OTHER PUBLICATIONS
Notice of Allowance received for U.S. Appl. No. 13/092,797, mailed on Apr. 3, 2012, 10 pages.
Bai et al., "Mitigation of Thermal Lensing Effect as a Brightness Limitation of High-Power Broad Area Diode Lasers", Proc. of SPIE, vol. 7953, Feb. 16, 2011, pp. 79531F-1-79531F-7.

*Primary Examiner* — Armando Rodriguez
(74) *Attorney, Agent, or Firm* — Morrison & Foerster LLP (57) ABSTRACT

A diode-laser having an elongated diode-laser emitter is mounted on a relatively massive heat-sink. Two parallel grooves are machined into the heat-sink to leave a relatively narrow elongated ridge of the heat-sink between the grooves. The ridge has a width about equal to or narrower that the width of the emitter. The diode-laser is mounted on the heat-sink such that thermal communication between the emitter and heat-sink is essentially limited to thermal communication with the ridge.

15 Claims, 8 Drawing Sheets

BROAD-AREA EDGE-EMITTING SEMICONDUCTOR LASER WITH LIMITED THERMAL CONTACT

PRIORITY

This application is a continuation of U.S. patent application Ser. No. 13/092,797, filed Apr. 22, 2011, which in turn is a continuation of U.S. patent application Ser. No. 13/044,359, filed Mar. 9, 2011, the disclosure of which is incorporated herein by reference.

TECHNICAL FIELD OF THE INVENTION

The present invention relates in general to edge-emitting semiconductor lasers (diode-lasers). The invention relates in particular to increasing brightness in a broad area diode-laser by minimizing slow-axis beam divergence of the laser.

DISCUSSION OF BACKGROUND ART

A diode-laser is usually defined in an epitaxially-grown separate-confinement semiconductor heterostructure. The heterostructure typically includes one or more active or quantum-well layers bounded by undoped waveguide layers. The waveguide layers provide optical confinement of light generated in the active layer or layers when current is passed through the diode. The waveguide and the active layer or layers are usually referred to as the active region of the diode-laser.

The active layer is bound on one side by one or more n-doped cladding electrical confinement layers. The other side is bounded by one or more p-doped cladding layers. The cladding layers provide the p- and n-sides of the diode and serve to confine carriers in the active region. The carriers "fall" into the quantum-well layer or layers where recombination of the carriers generates the laser radiation. Typically, the heterostructure is grown on an n-type single crystal substrate which is much thicker than the heterostructure. This leaves the p-side of the diode uppermost.

A common type of diode-laser is a "gain-guided" type wherein the laser is defined in the heterostructure by an electrical contact or "stripe" on the p-side (uppermost-side) of the diode. Diode-lasers are plural grown on the substrate, which is diced to leave individual lasers defined in what is referred to as a chip. Alternatively the chip dicing can be such that a linear array diode-lasers is left on what is known to practitioners of the art as a diode-laser bar.

A diode-laser can have a very high efficiency, for example, greater than about 50%. However, that still results in a significant amount of heat being generated in addition to the laser-radiation. For this reason, diode-lasers in individual or array (diode-laser bar) form are invariably mounted "p-side down" on a relatively massive heat-sink. Usually, the heat-sink provides the p-side electrical contact with the strip of the diode laser being defined by etching an equivalent "slot" in an insulating layer covering the "chip" or "bar", and metalizing the slot.

A diode-laser may have a length between about 1.0 millimeters (mm) and 5.0 mm. The active region has a height (in the thickness direction of the layers of the heterostructure) of about 1.0 micrometers (µm). Standard practice is to select a length in this range and increase power by increasing the stripe-width (emitter width) of the laser. This width may be on the order of about 100 µm for a laser delivering about 5 Watts (W) of power.

A significant problem with increasing the laser (stripe) width is that, generally, the wider the stripe, the less is the brightness of an emitted beam in an axis (the slow axis) parallel to the stripe-width direction. An indicator of brightness is the slow-axis divergence of the beam measured in the far field. The wider the divergence, the less the brightness. The divergence is typically a relatively weak function of current. Diode-laser beam brightness is a critical parameter for certain applications such as pumping of fiber lasers where beam-parameter product of the active fiber is limited by the fiber design, and increased diode-laser beam brightness results in higher pumping levels for the fiber laser.

Diode-lasers have achieved what might be defined as a commodity status commercially, with keen price and performance competition among manufacturers. Even a modest difference in brightness, for example about 10%, between diode-lasers having the same nominal output power and comparable cost could cause a buying decision to made in favor of the brighter diode-laser. Not surprisingly, there is a continuing need for brightness improvement in diode-lasers.

SUMMARY OF THE INVENTION

In one aspect of the present invention, diode-laser apparatus comprises a heat-sink and a diode-laser having a diode-laser emitter defined therein. The diode-laser is mounted on the heat-sink for limiting temperature rise of the diode-laser emitter during operation by thermal communication of the diode-laser emitter with the heat-sink. Thermal communication between the diode-laser emitter and the heat-sink is limited to a width of the heat-sink about equal to or less than the emitter width.

In a preferred embodiment of the invention, the heat-sink has parallel grooves formed therein leaving a narrow ridge therebetween. The ridge has a width about equal to or less than the emitter width. The diode-laser is mounted on the heat-sink such that thermal communication of the emitter with the heat-sink is limited to thermal communication of the emitter with the ridge.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
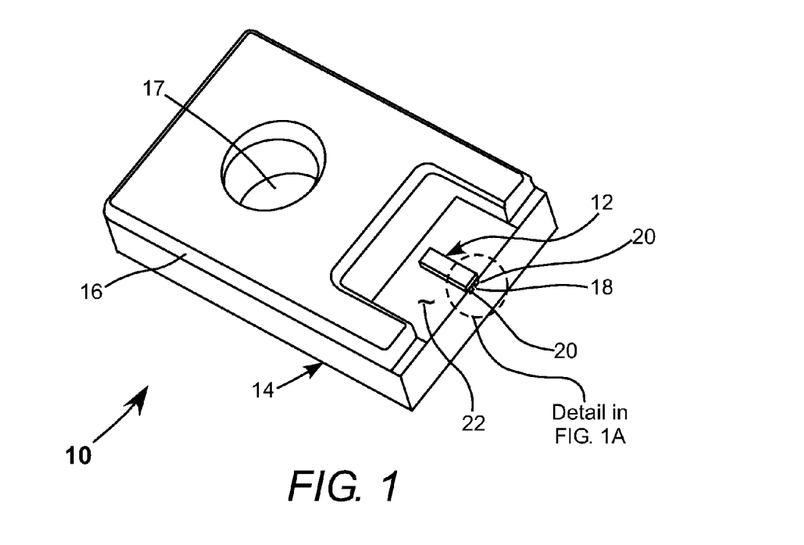
FIG. 1 schematically illustrates diode-laser package in accordance with the present invention including a heat-sink having two parallel grooves machined therein to leave a narrow ridge and a diode-laser having an emitter-stripe slightly wider than the ridge and in thermal contact therewith, thereby limiting thermal contact of the heat-sink to the emitter.
Figure 1A:
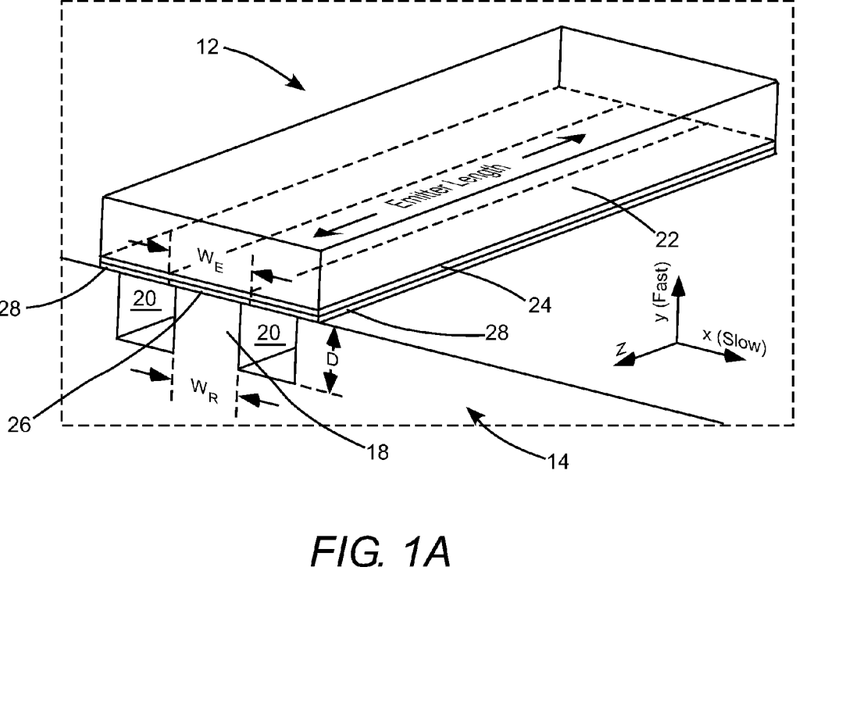
FIG. 1A schematically illustrates details of the grooves ridge and diode-laser of FIG. 1.

Referring now to the drawings, wherein like components are designated by like reference numerals, FIG. 1 schematically illustrates one preferred embodiment 10 of a diode-laser package in accordance with the present invention. FIG. 1A schematically illustrates further detail of package 10. The package includes a diode-laser 12 mounted on a copper heat-sink 14. A ceramic insulator 16 is attached to the heat-sink. An aperture 17 extends through the ceramic insulator and the heat-sink to allow for mounting the package.

Referring in particular to FIG. 1A, the diode-laser includes a separate confinement heterostructure 24 grown on an n-doped single crystal substrate 22. An insulating layer 28 has an opening formed therein exposing a metalized strip 26 defining the emitter width as is known in the art. The diode laser has a slow axis (x-axis) parallel to the emitter width and a fast-axis (y-axis) perpendicular to the slow-axis. The emitter length is perpendicular to the fast- and slow-axes and defines the propagation-axis axis of the diode-laser.

Heat-sink 14 has grooves 20 therein, leaving a ridge 18 therebetween. The grooves and the ridge are parallel to each other and parallel to the z-axis of the laser. Ridge 18 has a width $W_R$ which is about equal to or less than the emitter width $W_E$ (see FIG. 1A). The ridge has a height, i.e., grooves have a depth, here about equal to the ridge width. It should be noted that in FIG. 1A the groove, ridge, and substrate dimensions are, relatively, about to scale. The thicknesses of the hetero structure, metalizing, and insulating layers are exaggerated for convenience of illustration.

The diode-laser is attached to the heat-sink with a layer 22 of indium solder (shown in FIG. 1 but not in FIG. 1A). The length of the emitter is aligned with the length of the groove. The width of the diode-laser substrate is somewhat greater than the total width of the grooves and ridge such that the diode-laser is supported by the heat-sink the along the edges of the substrate with essentially no thermal communication with the emitter. Accordingly, thermal communication between the diode-laser and the heat-sink, from the emitter point of view, is essentially limited to the emitter itself. This results in heat flow from the emitter to the heat-sink being primarily one dimensional in the fast-axis direction with insignificant lateral heat-flow through the substrate.

Set forth below are performance results for one example of inventive diode-laser package 10. In this example substrate 22 is an n-type gallium arsenide (GaAs) substrate having a width of 500 μm a length of 1.5 mm and a thickness of 140 μm. Heterostructure 24 includes an active layer of gallium arsenide phosphide (GaAsP) for an emission-wavelength of about 808 nm. The active layer is bounded by waveguide layers of indium gallium phosphide (InGaP). Cladding layers are n-doped aluminum indium gallium arsenide (AlInGaAs) and p-doped AlInGaAs. The total thickness of p-side waveguide and cladding layers is about 1.7 micrometers. The emitter width $W_E$ is 150 μm. Ridge 18 has a width $W_R$ of 130 μm. and a height D of 130 μm. Grooves 20 have a width larger than that of the ridge. This 808 nm diode-laser is a of a type sometimes referred to as a "mesa" type diode-laser laser wherein definition is provided to the emitter stripe by etching away on either side of the stripe the p-side cladding layer and part of the thickness of the p-side waveguide layer.

Certain results are compared with those of a conventional (prior-art) diode-laser package similar to package 10 but wherein the heat-sink does not have grooves and a ridge, such that the entire length and width of the p-side of the diode-laser is in thermal contact with the heat-sink, thereby permitting lateral flow into the heat-sink in the region of the emitter/heat-sink interface. Diode-laser materials and dimensions are the same in each case.

Figure 2:
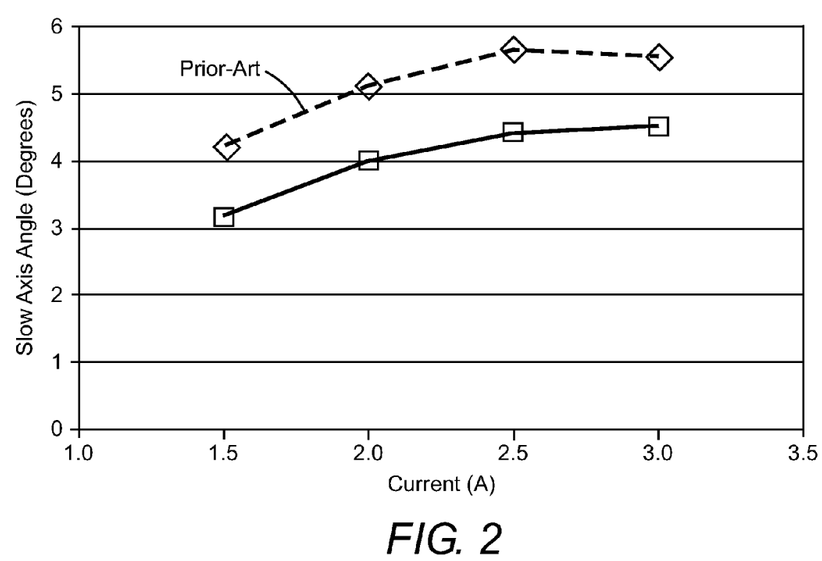
FIG. 2 is a graph schematically illustrating measured divergence angle as a function of diode-laser current for an example of the diode-laser of FIG. 1 and for a conventional diode-laser where thermal contact with the heat-sink is not limited to the emitter.

FIG. 2 is a graph schematically illustrating measured divergence angle as a function of diode-laser current for an example of the diode-laser of FIG. 1 and for a conventional diode-laser where thermal contact with the heat-sink is not limited to the emitter. The diode-laser is of the 808 nm type described above having an emitter width of 150 μm and a length of 1.5 mm on a heat-sink ridge of width 130 μm. Measured values for the inventive and prior-art lasers are indicated by squares and diamonds respectively. The measurements are joined to indicate trend. It can be seen that generally the inventive package provides a slow-axis divergence angle (FWHM) about 1° less than the divergence angle of the prior-art package, with the biggest difference occurring at a diode-laser current of about 2.5 Amps.

Figure 2A:
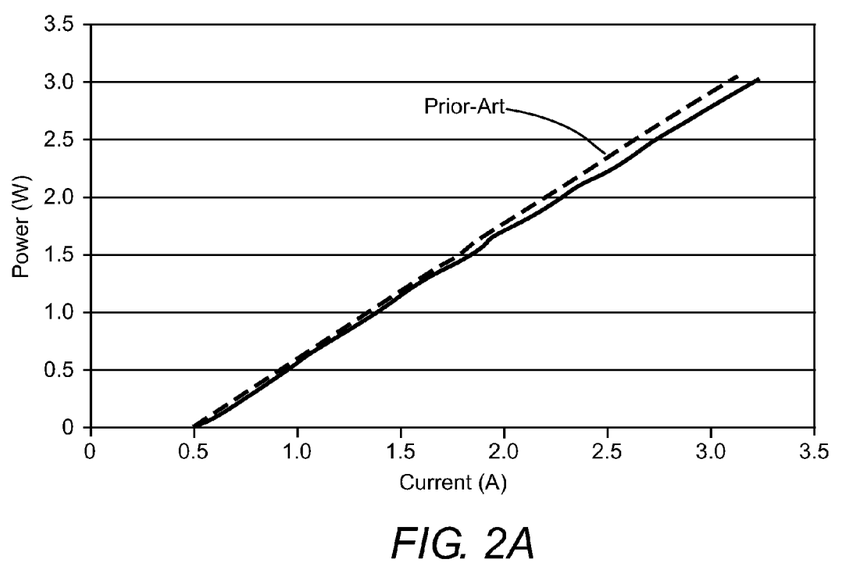
FIG. 2A is a graph schematically illustrating measured output power as a function of diode-laser current for the inventive and conventional lasers of FIG. 2.

Although the inventive device operates at a higher junction temperature due to the limited thermal contact, there is no significant difference in output-power of the lasers as a function of diode-laser current as indicated by the graph of FIG. 2A.

Figure 3:
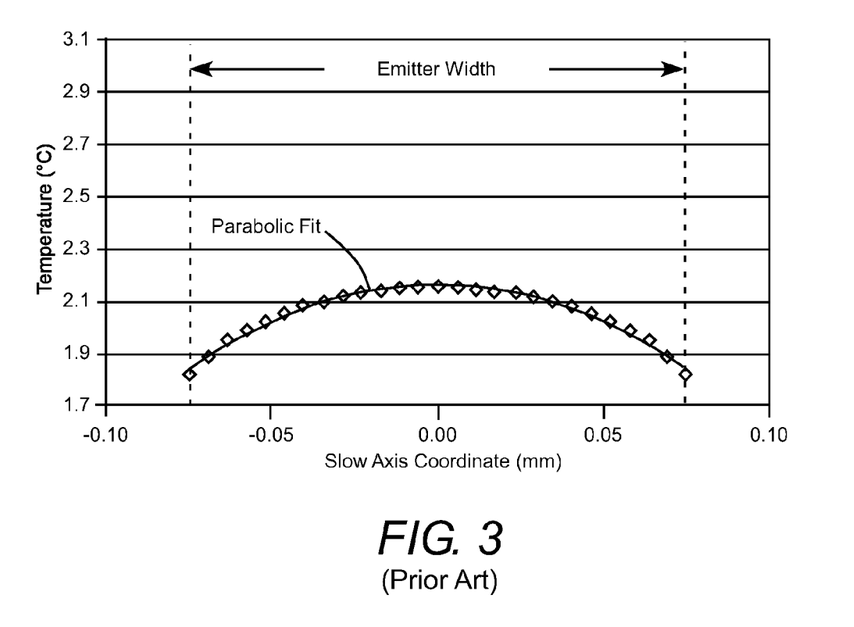
FIG. 3 is a graph schematically illustrating calculated temperature as a function of the slow-axis coordinate across the emitter-width for the conventional (prior-art) diode-laser of FIG. 2.

FIG. 3 is a graph schematically illustrating calculated temperature as a function of the slow-axis coordinate across the emitter-width for the conventional (prior-art) diode-laser of FIG. 2. The points are calculated at a plurality of discrete points indicated by diamonds. Superimposed is a parabolic curve fit of the form:

$$T(x) = T_0 - T_2 \cdot x^2 \tag{1}$$

In the fit of FIG. 3, $T_0$ has a value of 2.2° and $T_2$ has a value of about 57°/mm². It is believed that thermal lensing (a thermal stigmatic duct) associated with this relatively parabolic nature of the slow-axis temperature profile contributes significantly to slow-axis divergence.

Figure 4:
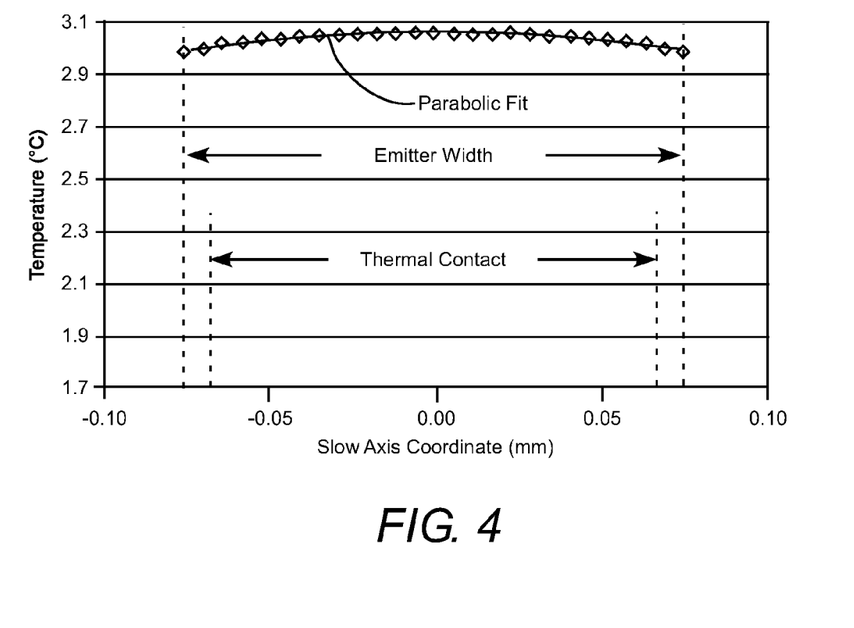
FIG. 4 is a graph schematically illustrating calculated temperature as a function of the slow-axis coordinate across the emitter-width for the inventive diode-laser of FIG. 2.

FIG. 4 is a graph schematically illustrating calculated temperature as a function of the slow-axis coordinate across the emitter-width for the inventive diode-laser of FIG. 2. Here again are discrete calculated points superimposed with a parabolic fit.

In the fit of FIG. 4, $T_0$ has a value of 3.062° and $T_2$ has a value of about 12.193°/mm². In this case the maximum temperature is about 1.6° higher than in the prior art case. However, as can be seen from the graphs of FIG. 2A this does not have a significant effect on power-output as a function of diode-laser current. The calculations of FIGS. 3 and 4 assume a heat load of 1.0 W which corresponds to about 1 Watt of laser power at 50% efficiency.

Figure 5:
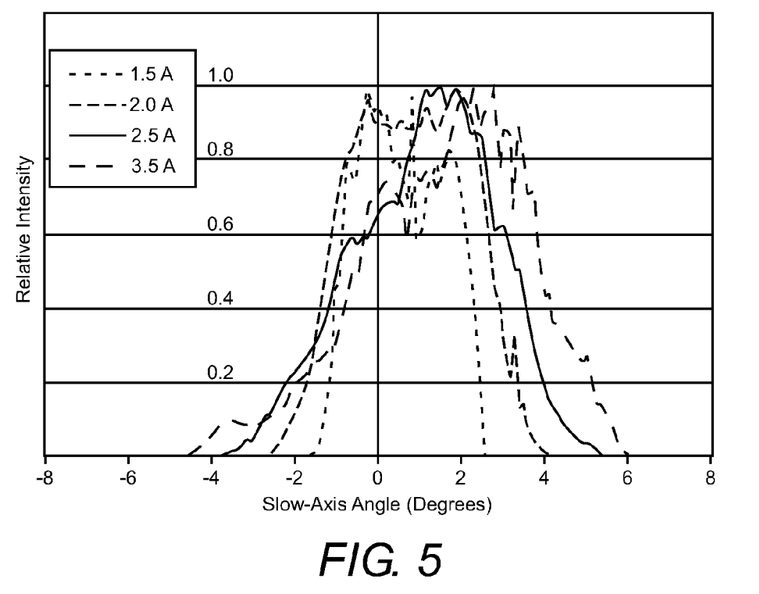
FIG. 5 is a graph schematically illustrating measured relative intensity in the far field as a function of divergence angle for the inventive laser example of FIG. 2.
Figure 6:
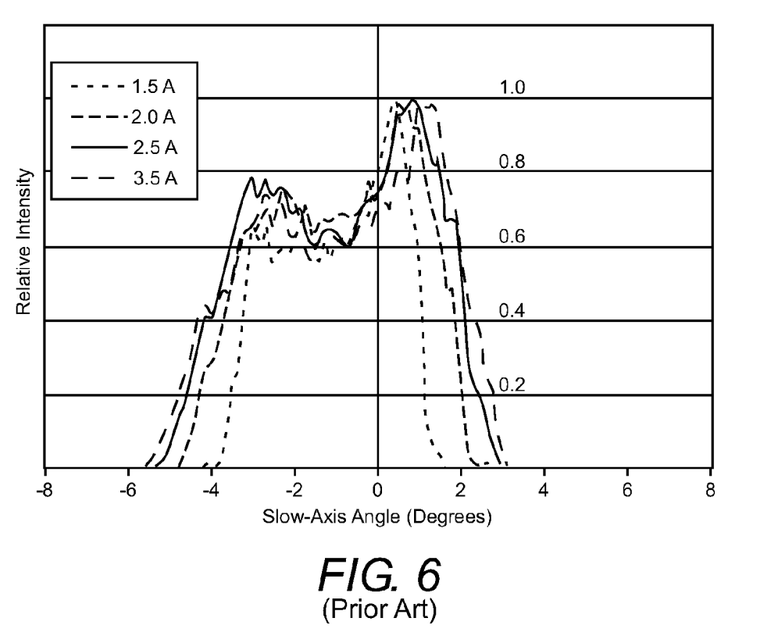
FIG. 6 is a graph schematically illustrating measured relative intensity in the far field as a function of divergence angle for the prior-art laser example of FIG. 2.

FIG. 5 is a graph schematically illustrating measured relative intensity in the far field as a function of divergence angle at four different diode-laser currents for the inventive laser example of FIG. 2. FIG. 6 is a graph schematically illustrating measured relative intensity in the far field as a function of divergence angle at the same four current values for the prior-art laser example of FIG. 2. It can be seen that at all current values the divergence measured at the FWHM points is narrower for the inventive package than for the prior-art package. It should be noted here that for the measurements of FIGS. 5 and 6, and similar measurements described hereinbelow, the diode laser was operated in a CW mode. The calculations were made using a simple thermal lens model for the lateral modes of the semiconductor laser.

Figure 7:
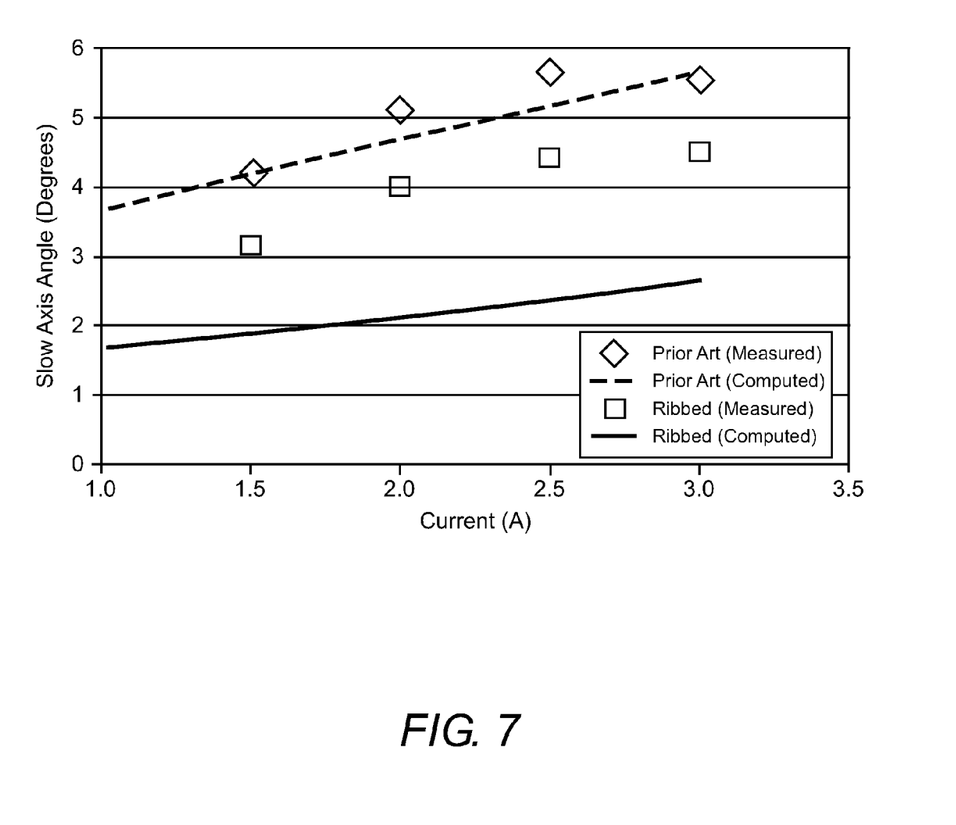
FIG. 7 is a graph similar to the graph of FIG. 2 but additionally showing computed slow-axis divergence as a function of current for the example of the inventive laser and the prior-art laser.

FIG. 7 is a graph similar to the graph of FIG. 2 but additionally showing computed slow-axis divergence as a function of current for the example of the inventive diode-laser package and the prior-art diode-laser package. The computations were made using the temperature profiles determined in FIGS. 3 and 4. It can be seen that in the case of the inventive diode-laser package the divergence predicted by the thermal model is much less than that divergence confirmed by the actual measured data. This implies that some other mechanism resulting from the limited thermal contact could be offsetting the potential advantage of the flatted thermal profile. It is believed without being limited to a particular hypothesis, one possible mechanism could be carrier-induced refractive variations offsetting the temperature-induced refractive index variations.

Figure 8:
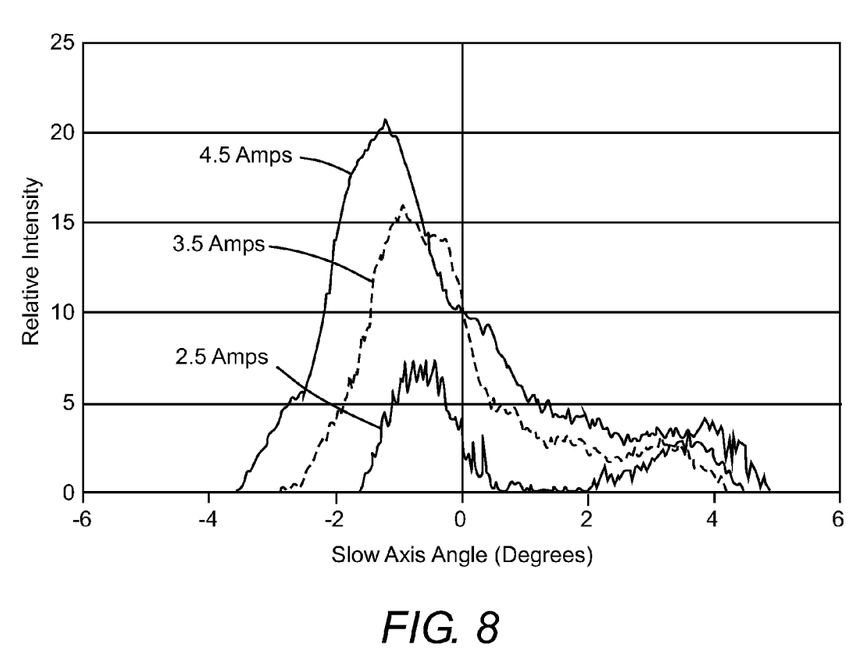
FIG. 8 is a graph schematically illustrating measured relative intensity in the far field as a function of divergence angle and current for another example of a diode-laser in accordance with the present invention.

FIG. 8 is a graph schematically illustrating measured relative intensity in the far field as a function of divergence angle and current for another example of the inventive diode-laser package. This example is similar to the above-described example with an exception that the emitter width $W_E$ of the diode-laser is 100 μm and the width $W_R$ of ridge 18 is 90 μm. The groove depth (ridge height) is 130 mm as in the previous example. This diode-laser was of a type usually referred to as a planar diode-laser wherein definition is provided for the emitter stripe by proton implantation of material on either side of the strip. The proton implantation disrupts the crystal structure of the material significantly reducing the electrical conductivity.

The diode-laser was also configured to emit radiation at a wavelength of 980 nm instead of 808 nm, and has a 2.0 mm emitter length. In this 980-nm diode-laser the quantum well layer is of indium gallium arsenide (InGaAs), and the waveguide layers are of aluminum gallium arsenide (AlGaAs). The cladding layers are also of AlGaAs but with a higher aluminum proportion than the cladding layers to provide a higher bandgap. This formulation is more efficient than that of the 808 nm diode-laser and can be expected to exhibit different carrier induced effects. By way of example, slow axis divergence for a prior-art 980-nm diode-laser package at 3.0 Amps current is 5.1° compared with 5.5° for the inventive device for the prior-art 808-nm diode-laser package.

Figure 9:
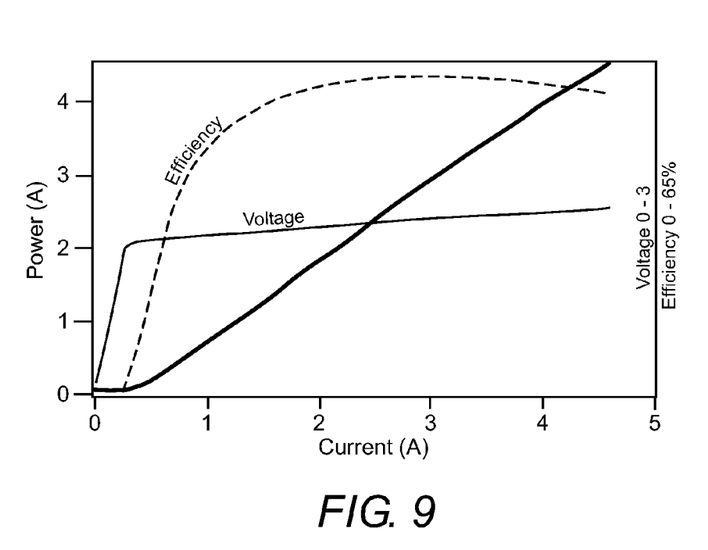
FIG. 9 is a graph schematically illustrating measured output-power, efficiency, and voltage as a function of diode-laser current for the inventive diode-laser example of FIG. 8.

It can be seen that at each of three current values the intensity profile is asymmetrical. Measured at the FWHM intensity points the total divergence at the highest diode-laser current value (4.5 Amps) is only about 3°, at the 5% peak intensity points (FW95), however, this divergence broadens to about 9°. At the lowest current value (2.5 Amps) there are essentially two intensity peaks with an angular separation of about 4°. FIG. 9 is a graph schematically illustrating measured output-power, efficiency, and voltage as a function of diode-laser current for the inventive diode-laser example of FIG. 8.

Figure 10:
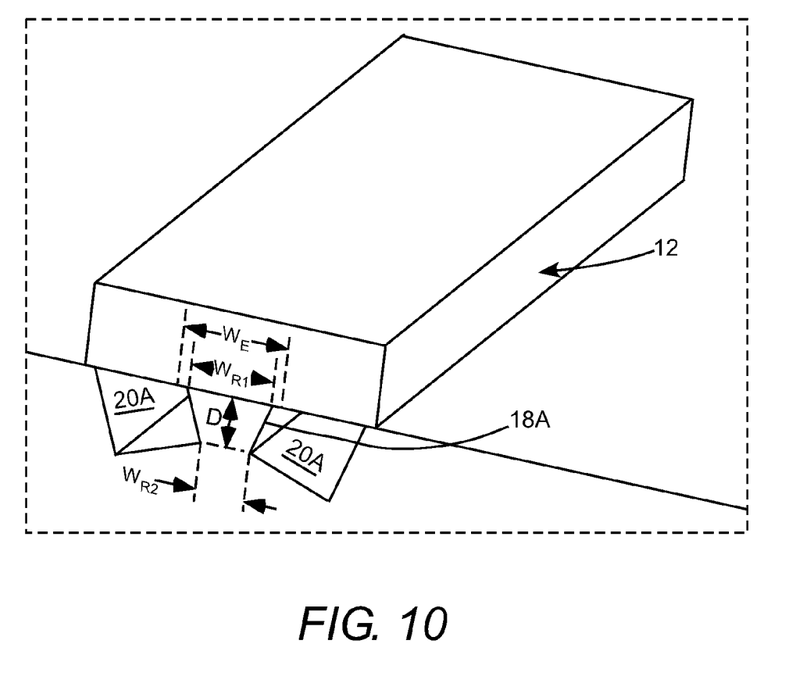
FIG. 10 schematically illustrates another embodiment of a diode-laser package in accordance with the present invention similar to the embodiment of FIG. 1 but wherein the ridge has a width which decreases in a direction away from the contact surface with the diode-laser.

Those skilled in the art, from the description of the present invention provided above will recognize that other thermal profiles could be created in a diode-laser emitter by changing the form of the heat-sink ridge which provides thermal contact between the emitter and the heat-sink. By way of example, FIG. 10 is a detailed view of a diode-laser and heat-sink schematically illustrating another example of a diode-laser package in accordance with the present invention in which straight sided ridge 14 of above-described examples is replaced by a ridge 14A which has a "dovetail" form. Diode-laser has the same form as in the other examples.

The dovetail ridge-form could be created by machining grooves 20A at an angle to the heat-sink surface as depicted in FIG. 10. This would provide a ridge having a width $W_{R1}$ at the thermal contact interface with the diode-laser emitter and a narrower width $W_{R2}$ at a y-axis depth D. $W_{R1}$ as in above described examples could be about equal to or slightly less than the emitter width $W_E$.

Figure 11:
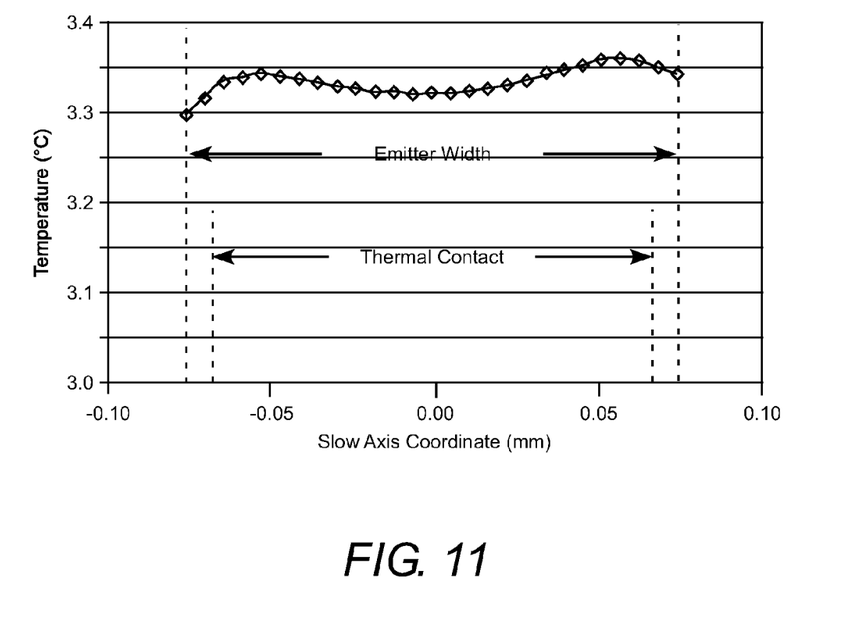
FIG. 11 is a graph schematically illustrating calculated temperature as a function of the slow-axis coordinate across the emitter-width for the inventive diode-laser of FIG. 10.

FIG. 11 is a graph schematically illustrating calculated temperature as a function of the slow-axis coordinate across the emitter-width for the inventive diode-laser package of FIG. 10. Here, it is assumed that emitter width WE is 150 μm, dovetail ridge widths $W_{R1}$ and $W_{R2}$ are 130 μm and 120 μm respectively, and depth D is 130 μm. It can be seen that the slow-axis thermal profile has a double peaked form.

Figure 12:
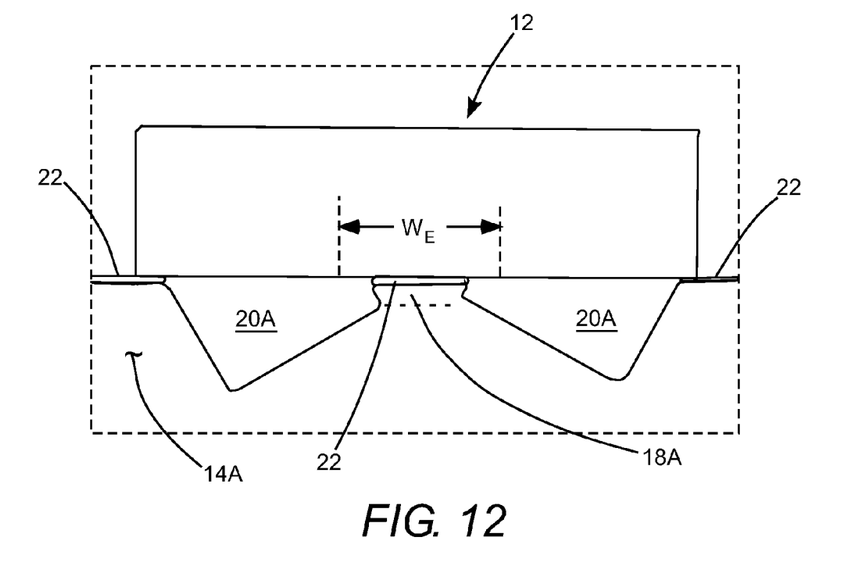
FIG. 12 is a monochrome outline reproduction of a micrograph depicting a cross-section of an actual heat-sink with diode laser thereon in the general form of FIG. 10.

FIG. 12 is a monochrome outline reproduction of a micrograph depicting a cross-section of an actual heat-sink formed by the above-discussed angle machining of grooves 20A. The diode laser thereon has the general form of FIG. 10. The emitter width $W_E$ indicated by dashed lines, here is about 100 μm. In this practical example the emitter length is 2.0 mm. Vestiges of indium solder layer 22 (see FIG. 1) are evident. It can be seen that what has actually been produced is a dovetail ridge of somewhat different proportions from those of the theoretical example of FIG. 10. It is estimated from the micrograph that here $W_{R1}$ is about 90 μm, $W_{R2}$ is about 80 μm, and depth D is about 30 μm.

Figure 13:
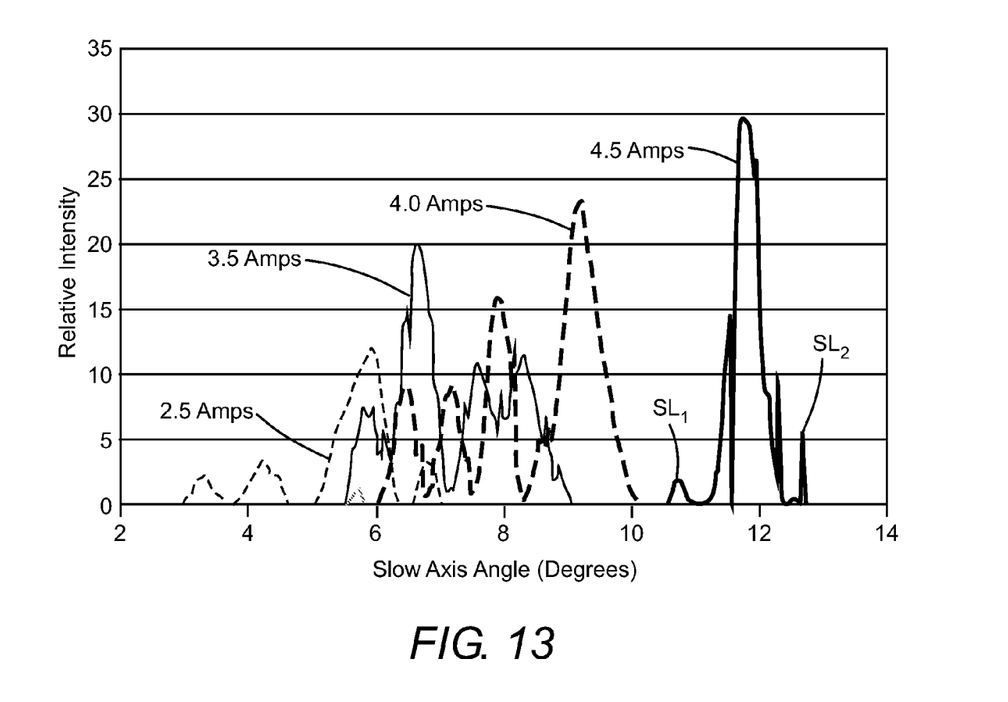
FIG. 13 is a graph schematically illustrating measured relative intensity in the far field as a function of divergence angle for a diode-laser package with the heat-sink and diode-laser arrangement of FIG. 12.

FIG. 13 is a graph schematically illustrating measured relative intensity in the far field as a function of divergence angle for a diode-laser package with the heat-sink and diode-laser arrangement of FIG. 12. It can be seen that in general there is considerable beam steering resulting from the particular heat-sink ridge arrangement with the beam to the positive side of the x-axis at all diode-laser currents. At lower diode-laser currents, the output beam is broken into a plurality of peaks. However, at the highest diode-laser current (4.5 Amps) the output coalesces into a essentially single intensity peak (discounting some very low level side-lobes such as SL1 and SL2) having a total divergence at FWHM less than 1.0° and (discounting the side-lobes) an FW95 of about 1.5°. The measured output-power, voltage, and efficiency as a function of diode-laser current are comparable to those of the example of FIGS. 8 and 9.

It should be noted here that the calculation of FIG. 11 assumed a 150 μm-wide and 1.5 mm-long emitter stripe. The measured result of FIG. 13 (for the reduced to practice device) is for a 100 μm-wide and 2.0 mm-long emitter stripe. The thermal model for the calculation should qualitatively scale to the different geometry.

Regarding construction methods for packages in according to the present invention, a preferred method remains machining or etching grooves in a heat-sink to leave a ridge of some sort to make thermal contact with the diode-laser emitter. In theory at least it is also possible to build up a ridge directly on a metalized emitter and solder the ridge to a plane surface of a relatively heat-sink. One possible way to do this would by building an electroplated layer on the metalized emitter. This would be practically difficult for a ridge having any useful depth, particularly so if the ridge were to have a non-orthogonal cross-section, such as the "dovetail-like" cross-section of the ridge of FIG. 10.

Those skilled in the art will also recognize that while the present invention has been described with reference to packaging a single diode-laser on a heat-sink the invention is also applicable to a plurality of diode-lasers in a linear array thereof formed in a diode-laser bar substrate. In this case, a longer heat-sink could have a plurality of parallel groove-pairs leaving a plurality of ridges corresponding to the plurality of diode-lasers in the array. The invention is also equally applicable to diode-lasers cooled on an actively cooled heat-sink such as a micro-channel cooled heat-sink.

In summary the present invention is described above in terms of preferred embodiments. The embodiment is not limited, however, to the embodiments described and depicted. Rather, the invention is limited only by the claims appended hereto.

What is claimed is:

1. A diode laser package comprising:
an elongated diode laser having a central emitting region bounded by side edges, said diode laser having a planar bottom surface; and
a heat sink having a planar surface thermally coupled to the bottom surface of the diode laser, said heat sink including a pair of elongated regions having a thermal conductivity less than the heat sink, said elongated regions being located substantially on either side of the emitting region of the diode laser.

2. A diode laser package as recited in claim 1 wherein the side edges of the emitting region overlap the elongated regions in the heat sink.

3. A diode laser package as recited in claim 1 wherein the elongated regions are defined by grooves formed in the heat sink, said grooves defining a ridge therebetween, with the ridge providing the primary thermal communication path between the diode laser and the heat sink.

4. A diode laser package as recited in claim 3 wherein the ridge has a dovetail-shaped cross-section with width of ridge adjacent the diode laser being the largest and with the width tapering down in a direction away from the diode laser.

5. A diode laser package as recited in claim 3 wherein the grooves have a substantially rectangular cross-section.

6. A diode laser package comprising:
an elongated diode laser having a central emitting region, said diode laser having a planar bottom surface; and
a heat sink having a planar surface thermally coupled to the bottom surface of the diode laser, said heat sink including an elongated central region, aligned with the emitting region of the diode laser configured to provide the primary heat communication path from the diode laser and wherein regions on either side of the central region have a thermal conductivity less than the central region.

7. A diode laser package as recited in claim 6 wherein the regions of the heat sink on either side of the central region are defined by grooves formed in the heat sink.

8. A diode laser package as recited in claim 7 wherein the grooves have a substantially rectangular cross-section.

9. A diode laser package as recited in claim 6 wherein the central region of the heat sink has a dovetail-shaped cross-section with width of central region adjacent the diode laser being the largest and with the width tapering down in a direction away from the diode laser.

10. A diode laser package comprising:
an elongated diode laser having a central emitter region, said emitter region having a fast axis in a first direction and slow axis in an axis perpendicular to the fast axis and a light propagation axis perpendicular to the fast and slow axes; and
a heat sink attached to the diode laser, said heat sink including a means to substantially limit the thermal communication between the diode laser and the heat sink to a region aligned with the emitter in a direction parallel to the fast axis.

11. A diode laser package as recited in claim 10 wherein said means is defined by a pair of elongated regions formed in the heat sink and located substantially on either side of the emitting region of the diode laser, said elongated regions having a thermal conductivity less than the intermediate region located between the elongated regions.

12. A diode laser package as recited in claim 11 wherein the side edges of the emitting region overlap the elongated regions in the heat sink.

13. A diode laser package as recited in claim 11 wherein the elongated regions are defined by grooves formed in the heat sink, said grooves defining a ridge therebetween, with the ridge providing the primary thermal communication path between the diode laser and the heat sink.

14. A diode laser package as recited in claim 13 wherein the ridge has a dovetail-shaped cross-section with width of ridge adjacent the diode laser being the largest and with the width tapering down in a direction away from the diode laser.

15. A diode laser package as recited in claim 13 wherein the grooves have a substantially rectangular cross-section.

* * * * *